United States Patent [19]

Richardson

[11] Patent Number: 5,017,977

[45] Date of Patent: May 21, 1991

[54] DUAL EPROM CELLS ON TRENCH WALLS WITH VIRTUAL GROUND BURIED BIT LINES

[75] Inventor: William F. Richardson, Richardson, Tex.

[73] Assignee: Texas Instruments Incorporated, Dallas, Tex.

[21] Appl. No.: 471,019

[22] Filed: Jan. 19, 1990

Related U.S. Application Data

[63] Continuation of Ser. No. 294,980, Jan. 3, 1989, abandoned, which is a continuation of Ser. No. 904,846, Sep. 5, 1986, abandoned, which is a continuation of Ser. No. 716,298, Mar. 26, 1985, abandoned.

[51] Int. Cl.$^5$ .......................................... H01L 27/115
[52] U.S. Cl. ..................................... 357/23.5; 357/55; 365/185
[58] Field of Search ..................... 357/23.5, 23.4, 23.6, 357/23.3, 55; 365/185

[56] References Cited

U.S. PATENT DOCUMENTS

| | | | |
|---|---|---|---|
| 4,163,988 | 8/1979 | Yeh et al. | 357/23.4 |
| 4,169,291 | 9/1979 | Roessler | 357/23.5 |
| 4,222,062 | 9/1980 | Trotter et al. | 357/23.5 |
| 4,353,082 | 10/1982 | Chatterjee | 357/23.4 |
| 4,364,074 | 12/1982 | Garnache et al. | 357/23.4 |
| 4,542,396 | 9/1985 | Schutten et al. | 357/23.5 |

Primary Examiner—William D. Larkins
Attorney, Agent, or Firm—W. James Brady, III; James T. Comfort; Melvin Sharp

[57] ABSTRACT

One embodiment of the present invention provides an EPROM array having floating gate field effect transistors formed on the sidewalls of trenches formed in a semiconducting substrate. Simultaneous with the fabrication of these trench wall transistors, column lines are formed between the trenches to the top surface in the bottom of the trenches which extend from one end to the other of the memory array.

6 Claims, 3 Drawing Sheets

DUAL EPROM CELLS ON TRENCH WALLS WITH VIRTUAL GROUND BURIED BIT LINES

This is a continuation of Ser. No. 07/294,980 filed Jan. 3, 1989, now abandoned, which was a continuation of Ser. No. 06/904,846 filed Sept. 5, 1986, now abandoned, which was a continuation of Ser. No. 06/716,298 filed Mar. 26, 1985, now abandoned.

FIELD OF THE INVENTION

This invention relates to the field of integrated circuit fabrication. More specifically, this invention relates to the field of electrically programmable read only memory (EPROM) fabrication.

BACKGROUND OF THE INVENTION

One goal on the fabrication of integrated circuitry is to produce a circuit having maximum circuit density. This goal extends to the fabrication of EPROMs. An EPROM is a read only memory device in which the stored data may be erased and new data written in its stead. A widely used type of EPROM is the floating gate field effect transistor type. See Sze, Physics of Semiconductor Devices, Section 8.61 (1981). A partial schematic diagram of an EPROM using floating gate field effect transistors is shown in FIG. 1. Memory cells 26-1-1 through 26-2-4 are floating gate field effect transistors. Row decoder 28 provides output signals on row lines 24-1 and 24-2 in response to signals provided on row address input leads 21 and from read/write indicator 23. Column decoder 29 provides and receives signals o column lines 25-1 through 25-5 in response to signals provided on column address input leads 22 and from read/write indicator 23. A memory output signal is provided on output lead 27. A data bit stored in, for example, memory cell 26-1-1 is read by providing a high voltage output signal on row line 24-1 and providing a low voltage output signal on all other row lines.

Column decoder 29 then senses, via column lines 25-1 and 25-2, the impedance of memory cell 26-1-1. If the floating gate memory of memory cell 26-1-1 contains excess electrons, the negative charge of these excess electrons raises the threshold voltage of memory cell 26-1-1 so that the voltage provided on row line 24-1 is insufficient to cause the channel of memory cell 26-1-1 to conduct. Therefore, column decoder 29 detects a high impedance and provides an appropriate signal on output lead 27. If there are no excess electrons stored on the floating gate on memory cell 26-1-1, then the voltage supplied on row line 24-1 is sufficient to cause memory cell 26-1-1 to conduct. Therefore, column decoder 29 detects a low impedance and provides the appropriate signal on output lead 27.

EPROM 20 is thus programmed by negatively charging the floating gate of selected memory cells. This is accomplished by injecting hot electrons through the insulating layer between the floating gate and the substrate of the memory cell.

Prior art methods of forming floating gate field effect transistors produced field effect transistors having a channel region horizontally disposed in a substrate, an insulator horizontally disposed above the channel, a floating gate horizontally disposed above the insulator, and a control gate insulated from and horizontally disposed above the floating gate.

SUMMARY OF THE INVENTION

One embodiment of the present invention provides a structure having floating gate field effect transistors formed on the sidewalls of trenches formed in a semiconducting substrate. Simultaneous with the fabrication of these trench wall transistors, column lines are formed in the bottom of the trenches and on the top surface between the trenches; these column lines extend the from one end to the other of the memory array.

First, a heavily doped layer, covering the area of the array, is formed in the surface of a semiconductor substrate. A thick oxide layer is then deposited above the heavily doped layer. Trenches are then patterned and etched through the oxide, the heavily doped layer and deep into the substrate using an anisotropic etching process. This etching step forms the portion of the trench which defines the channel length of the floating gate field effect transistors as well as the width of the column lines. Silicon dioxide is then deposited on the exposed surfaces of the trenches thus formed. The silicon substrate is once again anisotropically etched using a two step process which first removes the oxide in the bottom of the trenches and then anisotropically etches the silicon to form the portion of the trench which defines the cross-sectional area of the buried column lines of the EPROM.

The trenches are then filled with doped polycrystalline semiconductor material. The doping of this semiconductor material diffuses into the silicon substrate during subsequent processing steps. This diffusion forms the drain of the floating gate field effect transistors. The polycrystalline silicon and the silicon dioxide on the sidewalls is then etched back to define the column lines in the bottom of the trenches. A gate oxide layer is thermally grown on the sides of the trenches. A layer of polycrystalline silicon is then deposited on the surface of the gate oxide layer using chemical vapor deposition which provides a conformal polycrystalline silicon layer. This layer is anisotropically etched to provide polycrystalline sidewalls on the sides of the trenches. An interlevel dielectric is then grown or conformally deposited on the surface of the silicon substrate. A polycrystalline silicon layer which will form the row lines of the EPROM is then deposited on the surface of the substrate. A mask which defines the row lines is then formed on the surface of this polycrystalline silicon layer. The polycrystalline silicon layer is then etched to remove the areas between the formed row lines and further etches are performed to remove the interlevel dielectric and floating gate polycrystalline silicon between the EPROM cells.

Thus vertical floating gate field effect transistors are fabricated on either side of a trench, column lines are formed between and in the bottom of the trenches, and row lines are formed perpendicular to the trenches.

DETAILED DESCRIPTION

Figure 2A:
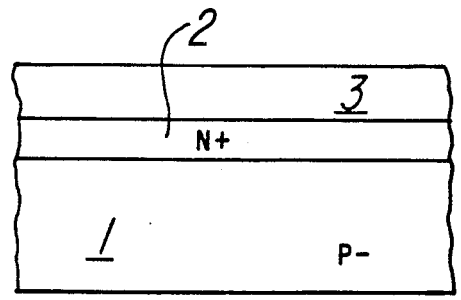
FIGS. 2A–2G are side view schematic diagrams depicting the processing steps necessary to form one embodiment of the present invention.

FIGS. 2A–2G are side view schematic diagrams depicting the processing steps necessary to form one embodiment of the present invention. In FIG. 2A doped layer 2 is formed using techniques well known in the art in substrate 1. Thick silicon dioxide layer 3 is then formed using chemical vapor deposition on the surfaces of doped layer 2. A photoresist layer (not shown) which defines trenches running the length of the array is then formed and patterned on the surface of silicon dioxide layer 3. This pattern is used to etch trenches in silicon dioxide layer 3.

Figure 2B:
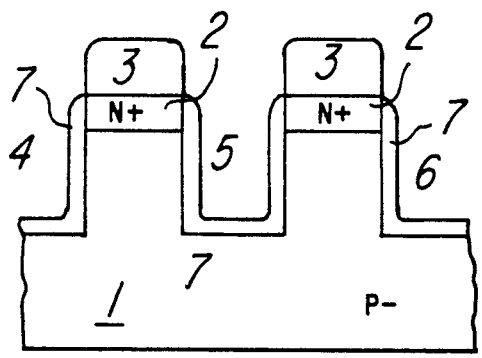

Substrate 1 is then etched using an anisotropic etching process which selectively etches crystalline silicon but does not etch silicon dioxide regions 3 in order to form trenches 4, 5 and 6 of FIG. 2B. Silicon dioxide layer 7 is then thermally grown on the sides of trenches 4, 5 and 6 to a thickness sufficient to block subsequent diffusion of N type dopant. A thickness of approximately 2000 angstroms is usually sufficient. This provides the structure shown in FIG. 2B. The structure of FIG. 2B is then anisotropically etched to remove the portions of silicon dioxide layer 7 in the bottom of trenches 4, 5 and 6 and is then further anisotropically etched to extend trenches 4, 5 and 6 further into substrate 1. This second etch defines the cross-sectional area of the column lines which will be formed in the bottoms of trenches 4, 5 and 6.

Figure 2C:
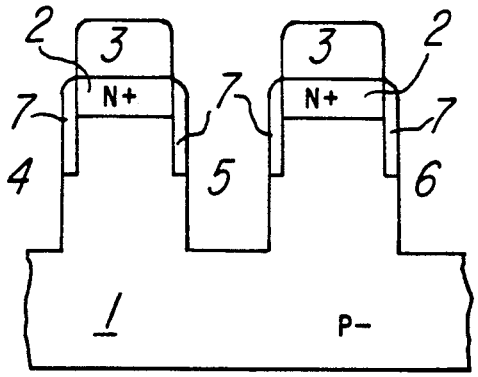
Figure 2D:
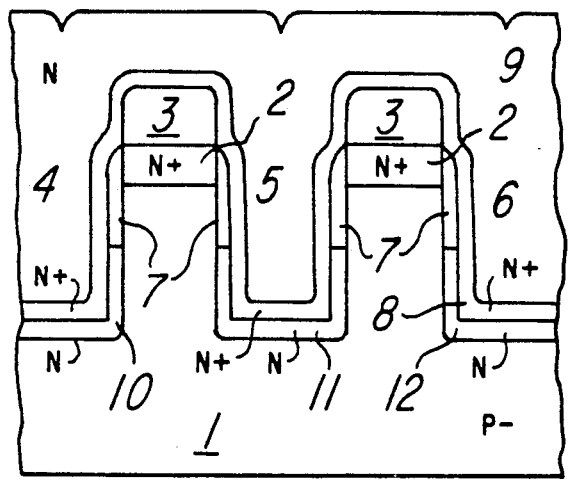

A layer of polycrystalline silicon 8 is then deposited on the surface of the structure of FIG. 2C. Polycrystalline silicon layer 8 is doped to the maximum doping level possible for polycrystalline silicon using dopant co-deposition or phosphorous oxychloride doping. Polycrystalline silicon layer 9 is then deposited to entirely fill trenches 4, 5 and 6 to form the structure shown in FIG. 2D. During further processing, dopant atoms diffuse from polycrystalline silicon layer 8 into polysilicon layer 9 and substrate 1 to form diffused regions 10, 11 and 12 as shown in FIG. 2D. Thus, polycrystalline silicon layers 8 and 9 become indistinguishable.

Figure 2E:
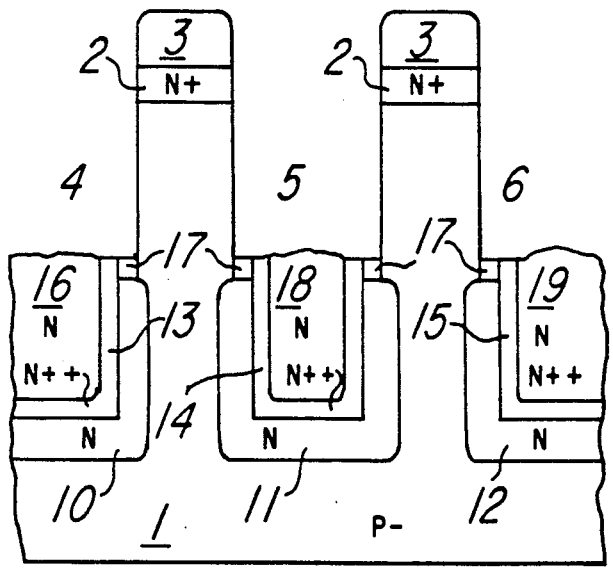
Figure 2F:
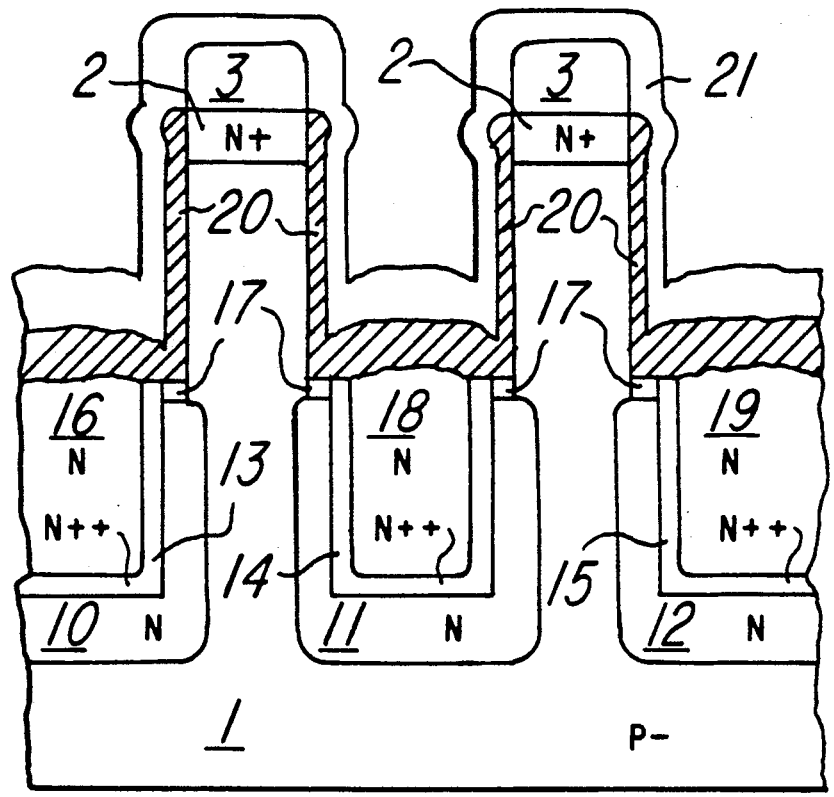

Polycrystalline layers 8 and 9 are then etched back into trenches 4, 5 and 6 to provide column lines 16, 18 and 19 as shown in FIG. 2E. Silicon dioxide layers 7 are etched back to provide spacer regions 17 as shown in FIG. 2E.

Figure 2G:
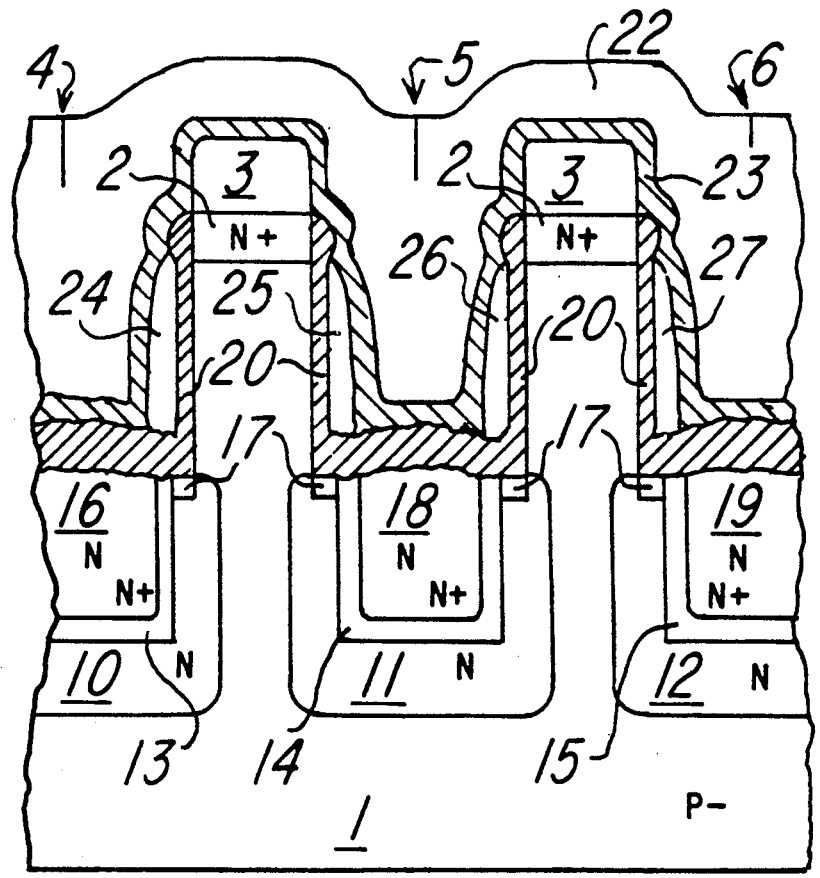

In the preferred embodiment, the structure of FIG. 2E is then subjected to an oxidizing process which provides a thicker oxider layer from polycrystalline silicon and from heavily doped layer 2 than that formed from crystalline silicon, such as thermal oxidation in a steam ambient, at approximately 850 degrees centigrade, for approximately 10 minutes. This provides silicon dioxide layers 20 a shown in FIG. 2F. Polycrystalline silicon layer 21 is then deposited using chemical vapor deposition. Polycrystalline silicon layer 21 is then anisotropically etched to provide floating gate lines 24, 25, 26 and 27 as shown in FIG. 2G. The thicker portions of silicon dioxide layer 20 above protect column lines 16, 18 and 19 from this etch. Interlevel insulator layer 23 is then formed using techniques well known in the art. A preferred technique for forming interlevel insulator layer 23 is chemical vapor deposition of a layer of silicon dioxide approximately 250 angstroms thick followed by a layer of silicon nitride deposited by chemical vapor deposition which is also approximately 250 angstroms thick.

Figure 1:
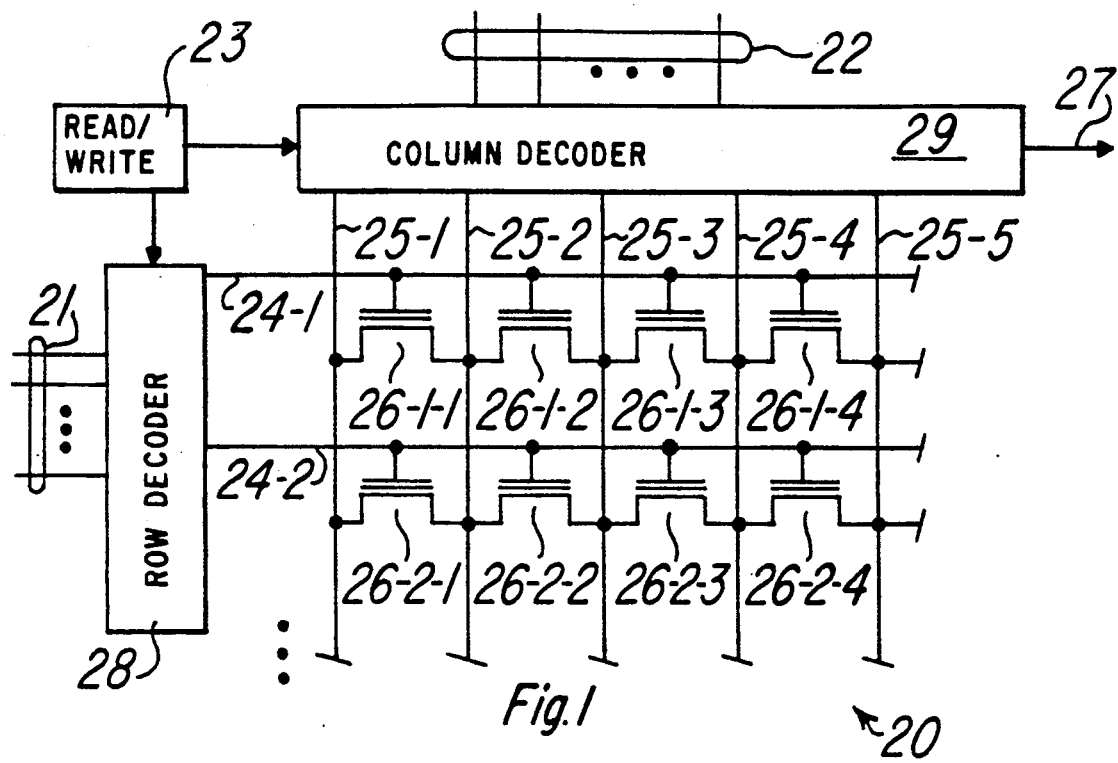
FIG. 1 is a schematic diagram of an EPROM.
Figure 3:
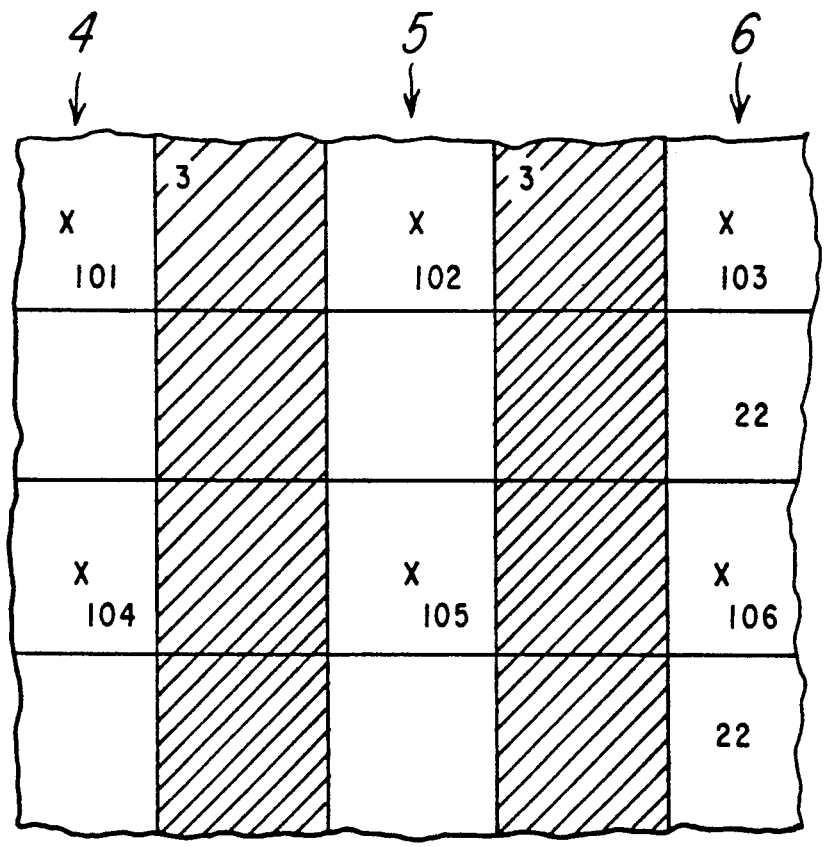
FIG. 3 is a plan-view diagram indicating those areas of the EPROM which are etched to define the edges of the floating gates.

Polycrystalline silicon layer 22 is then deposited to provide the structure shown in FIG. 2G. Polycrystalline silicon layer 22 is then patterned and etched to provide row lines running horizontal to the page. FIG. 3 is a partial-plan view of the EPROM array of this invention. Insulator regions 3 run perpendicular to the page in FIG. 2G. Row lines 22 run horizontally in the plane of the page in FIG. 2G. Etching regions 101, 102, 103, 104, 105, and 106 are not protected by a photoresist mask formed on the surface of polycrystalline silicon row lines 22 nor by thick protective oxide regions 3. Etching regions 101–106 are then etched by: first, completely etching polycrystalline layer 22 from etching regions 101–106; then, using a brief silicon nitride etch, removing the silicon nitride layer of interlevel dielectric 23; and then, using a brief silicon dioxide etch removing the oxide layer of interlevel oxide region 23. A second polycrystalline silicon etch is then performed to remove the portion of floating gates 24, 25, 26 and 27 in etching regions 101–106. This polycrystalline etching step defines separate floating gate regions for each EPROM cell in the array of this embodiment of the invention.

A protective silicon dioxide layer (not shown) is then formed over the entire surface of the structure of FIG. 3. Openings are then etched to contact column lines 16, 18 and 19, and source/drain diffusions 2 using techniques well known in the art. Thus an EPROM array is formed having a control gate comprising row lines 22, floating gates, such as floating gates 24, 25, 26 and 27, and source/drain regions 10, 11, 12 and 2. Floating gates 24, 25, 26 and 27 are charged by injecting hot electrons through silicon dioxide layer 20 from substrate 1.

TECHNICAL ADVANTAGES

An EPROM constructed according to the teachings of this invention provides a nonvolatile memory circuit of far greater density than those achievable by techniques known in the art. A floating gate field effect transistor cell is formed on the sidewall of a trench requiring no planar surface area. Thus an array occupying a very small surface area may be fabricated. However, present techniques limit the size of row and column decoders and thus set a minimum array size. In this case, the technique of this invention allows the fabrication of an array with very wide row and column lines. This lowers the resistance of the row and column lines, thus reducing the RC time constant of the array and providing a faster memory.

I claim:
1. An eraseable programmable read-only memory comprising:
 (a) a substrate containing a plurality of elongated, parallel trenches;
 (b) a plurality of first source/drain regions formed in said substrate near the bottom of said trenches, all of said first source/drain regions near the bottom of a single one of said trenches being connected together but isolated from all of said first source/drain regions near the bottom of others of said trenches;
 (c) a plurality of second source/drain regions formed on the surface of said substrate near the mouth of said trenches;
 (d) a plurality of third source/drain regions formed on the surface of said substrate near the mouth of said trenches on the opposite side of said trenches from said plurality of second source/drain regions and directly opposite said second source/drain regions;

(e) a plurality of first channel regions in said substrate extending substantially vertically between said first and said second source/drain regions;

(f) a plurality of second channel regions in said substrate extending substantially vertically between said first and said third source/drain regions;

(g) a plurality of first floating gates disposed on a sidewall of said trenches adjacent to and insulated from said first channel regions;

(h) a plurality of second floating gates disposed on a sidewall of said trenches adjacent to and insulated from said second channel regions;

(i) a plurality of first control gates extending into said trenches adjacent to, insulated from and capacitively coupled to respective corresponding ones of said plurality of first floating gates; and (j) a plurality of second control gates extending into said trenches adjacent to, insulated from, and capacitively coupled to respective corresponding ones of said plurality of second floating gates.

2. An array of floating gate transistors arranged in rows and columns, comprising:

a substrate containing a plurality of elongated, parallel trenches;

a plurality of first source/drain regions formed in said substrate near the bottom of said trenches, all of said first source/drain regions near the bottom of a single one of said trenches being connected together but isolated from all of said first source/drain regions near the bottom of others of said trenches;

a plurality of second source/drain regions formed on the surface of said substrate near the mouth of said trenches;

a plurality of third source/drain regions formed on the surface of said substrate near the mouth of said trenches on the opposite side of said trenches from said plurality of second source/drain regions and directly opposite said second source/drain regions;

a plurality of first channel regions in said substrate extending substantially vertically between said first and said second source/drain regions;

a plurality of second channel regions in said substrate extending substantially vertically between said first and said third source/drain regions;

a plurality of first floating gates disposed on a sidewall of said trenches adjacent to and insulated from said first channel regions;

a plurality of second floating gates disposed on a sidewall of said trenches adjacent to and insulated from said second channel regions;

a plurality of first control gates extending into said trenches adjacent to, insulated from and capacitively coupled to respective corresponding ones of said plurality of first floating gates; and a plurality of second control gates extending into said trenches adjacent to, insulated from, and capacitively coupled to respective corresponding ones of said plurality of second floating gates.

3. An array of floating gate field effect transistors according to claim 2 wherein each of said first floating gates overlaps respective first and second source/drain regions and each of said second floating gates overlaps respective first and third source/drain regions.

4. An array of floating gate field effect transistors as in claim 2, wherein said substrate comprises crystalline silicon.

5. An array of floating gate field effect transistors as in claim 2 wherein each row of floating gate field effect transistors includes a respective plurality of first and second control gates, said respective plurality of first and second control gates for each row of floating gate field effect transistors being electrically connected.

6. An array of floating gate field effect transistors according to claim 2, wherein each row of floating gate field effect transistors includes a respective plurality of first and second control gates, said respective plurality of first and second control gates for each row of floating gate field effect transistors being provided by a single control gate extending into said trenches.

* * * * *